United States Patent
Gambin et al.

(10) Patent No.: US 6,798,809 B1
(45) Date of Patent: Sep. 28, 2004

(54) GAINNASSB QUANTUM WELL SEMICONDUCTOR DEVICES

(75) Inventors: Vincent Gambin, Menlo Park, CA (US); Wonill Ha, Mountain View, CA (US); James S. Harris, Stanford, CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 91 days.

(21) Appl. No.: 10/196,077

(22) Filed: Jul. 16, 2002

Related U.S. Application Data (63) Continuation-in-part of application No. 09/738,534, filed on Dec. 15, 2000, and a continuation-in-part of application No. 09/738,907, filed on Dec. 15, 2000, now abandoned.

(51) Int. Cl.[7] .............................................. H01S 5/00
(52) U.S. Cl. ......................................................... 372/45
(58) Field of Search ............................. 372/43–50, 96; 438/22–39

(56) References Cited

U.S. PATENT DOCUMENTS

| | | | |
|---|---|---|---|
| 5,068,868 A | 11/1991 | Deppe et al. | 372/45 |
| 5,524,017 A | 6/1996 | Endo | 372/46 |
| 5,638,392 A | 6/1997 | Ramdani et al. | 372/45 |
| 5,689,123 A | 11/1997 | Major et al. | 257/190 |
| 5,719,894 A | 2/1998 | Jewell et al. | 372/45 |
| 5,757,830 A | 5/1998 | Liau et al. | 372/36 |
| 5,904,549 A | 5/1999 | Sato | 438/478 |
| 5,923,691 A | 7/1999 | Sato | 372/46 |
| 5,936,929 A | 8/1999 | Jiang et al. | 369/112 |
| 5,937,274 A | 8/1999 | Kondow et al. | 438/47 |
| 6,081,470 A | 6/2000 | Vaccaro et al. | 365/215 |
| 6,081,541 A | 6/2000 | Adachi et al. | 372/45 |
| 6,207,973 B1 * | 3/2001 | Sato et al. | 257/98 |

FOREIGN PATENT DOCUMENTS

| | | | | |
|---|---|---|---|---|
| JP | 10-145003 A | 5/1998 | | H01S/3/18 |
| JP | 10-233557 A | 9/1998 | | H01S/3/18 |
| JP | 11-074607 A | 3/1999 | | H01S/3/18 |
| JP | 2000277867 A | 10/2000 | | H01S/5/343 |

OTHER PUBLICATIONS

K. Nakahara et al., 1.3—$\mu$m Continuous–Wave Lasing Operation in GaInNAs Quantum—Well Lasers, IEEE Photonics Technology Letters, vol. 10, No. 4, Apr. 1998, pp. 487–488.

\* cited by examiner

Primary Examiner—Quyen Leung (57) ABSTRACT

In connection with an optical-electronic semiconductor device, improved photoluminescent output is provided at wavelengths beyond 1.3 m. According to one aspect, Sb is used in, e.g. the active region of a GaInNAs-based quantum well laser diode with GaNAs-based barrier layers. Adding a small amount of Sb increases photoluminescence of the device while increasing the wavelength. Sb is used both as a surfactant, improving N and In incorporation into the active region, and an alloy constituent for red-shifting the wavelength of the device. In example implementations, both edge emitting laser devices and vertical cavity surface emitting laser (VCSEL) devices can be grown with room temperature emission from 1.3 to 1.6 $\mu$m.

55 Claims, 5 Drawing Sheets

GAINNASSB QUANTUM WELL SEMICONDUCTOR DEVICES

RELATED PATENT DOCUMENTS

This is a continuation-in-part of U.S. patent applications, Ser. No. 09/738,534, filed on Dec. 15, 2000 (STFD.012PA) and entitled "LASER DIODE DEVICE WITH NITROGEN INCORPORATING BARRIER," and is a continuation-in-part Ser. No. 09/738,907, filed on Dec. 15, 2000 Now Abandoned, (STFD.010PA) and entitled "METHOD FOR MANUFACTURING LASER DIODE WITH NITROGEN INCORPORATING BARRIER." Priority is claimed to subject matter common to these patent documents under 35 U.S.C. §120, and these patent documents are fully incorporated herein by reference.

FEDERALLY-SPONSORED RESEARCH OR DEVELOPMENT

This invention was made with Government support under contract MDA 972-00-1-0024 awarded by the Defense Advanced Research Projects Agency. The U.S. Government has certain rights in this invention.

Background Statements

The inventive aspects disclosed herein were made with Government support under contract N00014-01-1-00010 awarded by the Office of Naval Research. The Government has certain rights in these inventive aspects.

FIELD OF THE INVENTION

The present invention relates generally to optical semiconductor devices and is particularly advantageous for optical semiconductor devices operable in wavelengths above 1.3 μm.

BACKGROUND OF THE INVENTION

Over the past few decades, the field of optics has been used to enhance high-speed data communications in wide-ranging technology areas including, among a variety of others, laser printers, data storage, and optical telecommunications. In connection with optical telecommunications, for example, this development has largely displaced the large conical horn-reflector tower-mounted radio antennas having underground optical cables for telecommunication trunks to carry information traffic in the form of optical signals. Currently, quartz glass optical fibers are used to carry high volumes of data generated as light pulses at one end by laser diodes and detected at the other end by optical detectors.

A multi-heterojunction laser diode grown on a GaAs substrate is one common semiconductor device used as an optical transmitter for telecommunications applications. However, the relatively short wavelength of conventional GaAs devices (e.g., 820 nm) limits performance due to the wavelength dependent dispersion and loss properties of optical fiber. Additionally, the short wavelength limits the permissible optical power because of eye safety considerations. Longer optical wavelengths can overcome many of these limitations and allow data transmission at higher rates over longer distances. Efforts to improve long wavelength devices have included altering the various interfaces and internal compositions of each layer to tune the devices for minimum cost of fabrication, optimal device performance, and reductions in terms of size, heat generation and power consumption.

The wavelengths desired for laser sources in telecommunications are those for which the optical fiber has the lowest dispersion, 1.3 μm, or minimum loss, 1.55 μm. Thus, there have been ongoing efforts to produce improved optical semiconductor devices that operate at these wavelengths. There is no binary semiconductor with a bandgap at these wavelengths. Therefore, the focus has been to develop GaAs-based ternary or quaternary structures to achieve materials with bandgaps suitable for long wavelength devices.

The longest wavelengths available for devices on GaAs substrates have been typically around 1 μm and realized using single or multiple-layer InGaAs quantum wells. Growing InGaAs quantum wells on GaAs with optical wavelengths beyond 1.1 μm is difficult because increasing indium content further leads to the formation of crystalline defects and mechanical tension, compression or shear in and around the active layer. This internal stress can be attributable to, among other factors, lattice mismatch between the active region and the substrate, and improper temperature control during manufacture of the laser diode device. Inadequate temperature control during manufacture can also result in a higher threshold current of laser oscillation and poor temperature characteristics.

The addition of more indium to the InGaAs quantum well material, in an attempt to achieve longer wavelengths, is a limited approach because both the strain energy and the quantum confinement energy increase with increasing indium content. The quantum confinement energy increases because increasing indium results in smaller effective masses and deeper quantum wells which both serve to push the first quantum confined level to higher energies. Much of the decrease in the bulk energy gap associated with increasing the indium content of the quantum well material is negated, and more indium is required to achieve a given wavelength than would be predicted by the bulk bandgap dependence on the indium mole fraction.

Use of ternary materials, such as GaInAs, produces compressively strained structures when grown on GaAs substrates. Addition of a fourth small atom can be used to decrease the size of the lattice and reduce the mechanical strain of the structure. The addition of nitrogen to the laser diode active region composed of InGaAs can result in the longest wavelengths devices achievable on GaAs substrates. The nitrogen causes the bulk bandgap to significantly decrease and second, the associated smaller lattice constant of GaN results in less strain in GaInNAs compared to InGaAs without the nitrogen.

In a device that incorporates N in the active layer, several layers are included at the device center in active region of GaInNAs. This active region is used as the main source for the generation of light pulses, and includes outer GaAs contact layers grown on a GaAs substrate. To the inside of the outer contact layers and immediately bordering either side of the active layer are upper and lower cladding regions to contain core light while protecting against surface contaminant scattering. In response to a voltage differential presented via the electrodes at the outer contact layers, holes and electrons are respectively injected into the active layer from the layers above and below. The accumulation of these holes and electrons within the active layer results in their recombination, thereby stimulating the emission of photons and, oscillation at a wavelength defined largely by the composition of the active layer. Lasers operating at wavelengths beyond 1.3 μm have been demonstrated with InGaNAs active regions grown on GaAs substrates. Further, GaInNAs vertical cavity surface emitting laser (VCSEL) devices have been implemented.

Growing high quality GaInNAs material suitable for use in optical devices with wavelengths beyond 1.3 μm continues to be challenging. Compositions of GaInNAs that emit light significantly beyond 1.3 μm have thus far been impractical for use in optical devices due to high threshold currents.

SUMMARY OF THE INVENTION

The present invention is directed to an approach for improving the photoluminescent output of an optical-electronic semiconductor device at wavelengths longer than 1.3 µm through the incorporation of antimony into the active region of the device. Various example embodiments of the present invention are directed to and are advantageously used in many high-speed data communication applications, such as in the above-listed technology areas.

In accordance with one embodiment of the present invention, an optica-electronic semiconductor device includes a GaAs-based substrate and an active region over the GaAs-based substrate. The active region includes a GaInNAsSb-based quantum well layer adjacent a GaNAs-based barrier layer In another embodiment of the invention, an optical-electronic semiconductor device includes a GaAs-based substrate and an active region over the GaAs-based substrate. The active region includes a GaInNAsSb-based quantum well layer adjacent a GaNAs-based barrier layer and including crystal-defect causing impurities. The active region is annealed to remove point defects otherwise present in the active region. Portions of the optical-electronic semiconductor device are electrically coupled to the active region and are adapted for exciting the active region.

In yet another embodiment of the invention, a vertical cavity surface emitting optical-electronic semiconductor device includes a GaAs-based substrate, a first DBR region over the GaAs-based substrate and an active region over the first DBR region, the active region including a GaInNAsSb quantum well layer adjacent a GaNAs barrier layer and including crystal-defect causing impurities. The active region is annealed to remove point defects otherwise present in the active region. The device further includes a second DBR region over the annealed active region. The first and second DBR regions are oppositely-doped and oppositely-doped electrodes electrically coupled to the correspondingly respective first and second DBR regions, are adapted for exciting the active region and causing emissions through the GaAs-based substrate.

In another embodiment of the invention, an edge-emitting optical-electronic semiconductor device includes a GaAs-based substrate and an active region over the GaAs-based substrate. The active region includes multiple GaInNAsSb-based quantum well layers, each being surrounded by a pair of adjacent GaNAs-based barrier layers. The device further includes a first and a second cladding portion electrically coupled to the quantum well active region and adapted for exciting the active region.

Another embodiment of the invention includes a method for manufacturing an optical-electronic semiconductor device. The method includes providing a GaAs-based substrate and forming an active region over the GaAs-based substrate. The active region includes a GaInNAsSb-based quantum well layer adjacent a GaNAs-based barrier layer. The method further includes forming portions electrically coupled to the active region and adapted for exciting the active region.

In another embodiment of the invention, a method for manufacturing an optical-electronic semiconductor device includes providing a GaAs-based substrate and forming an active region over the GaAs-based substrate. The active region includes a GaInNAsSb-based quantum well layer adjacent a GaNAs-based barrier layer. The method further includes growing a layer over the active region while annealing the active region and providing portions of the optical-electronic semiconductor device electrically coupled to the active region and adapted for exciting the active region.

Another embodiment of the invention is directed to a method for manufacturing a VSCEL optical-electronic device including providing a GaAs-based substrate and forming a multiple quantum well active region over the GaAs-based substrate. The active region includes multiple GaInNAsSb-based quantum well layers, each being surrounded by a pair of adjacent GaNAs-based barrier layers. The method also includes forming mirror portions on either side of the multiple quantum well active region adapted for exciting the active region.

In yet another embodiment of the invention, a method for manufacturing an edge-emitter optical-electronic semiconductor device includes providing a GaAs-based substrate and forming a multiple quantum well active region over the GaAs-based substrate. The active region includes multiple GaInNAsSb-based quantum well layers, each being surrounded by a pair of adjacent GaNAs-based barrier layers. The method includes forming cladding portions electrically coupled to the quantum well active region and adapted for exciting the active region.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

Various aspects and advantages of the present invention will become apparent upon reading the following detailed description of various embodiments and upon reference to the drawings in which.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF THE VARIOUS EMBODIMENTS

The present invention is directed to a method and an optical device for achieving increased optical emission at longer wavelengths. According to one aspect of the present invention, it has been discovered that adding small amounts of antimony (Sb) to a structure using GaInNAs-based quantum wells significantly improves luminescent output. In this regard, antimony is used as both a surfactant, improving N and In incorporation at the surface of the GaInNAs layer, as well as an alloy constituent, further shifting the emission to longer wavelengths. Since quantum well strain can be compensated for by properly balancing the N versus In and Sb compositions, and by the use of tensile barriers such as GaNAs, the critical thickness of GaInNAsSb on GaAs does not limit the choice of bandgap.

The present invention is believed to be applicable to a wide variety of circuit arrangements including optical semiconductor devices and, more specifically, to such circuit arrangements operable in wavelength bands at 1.3 μm or above. The present invention incorporates quantum well active regions and/or barrier layers grown in the presence of antimony. Various example implementations of the present invention are described below through the following discussion of example applications. Those skilled in the art will appreciate that these implementations are merely examples and are not intended to limit the scope of the present invention.

A first example embodiment of the present invention is directed to a method for manufacture and an optical electronic semiconductor device using a GaAs-based substrate. Formed over the GaAs-based substrate is an active region having one or more GaInNAsSb-based quantum well layers. For such an implementation, forming a pair of GaNAs-based barrier layers on either side of each GaInNAsSb-based quantum well layer improves operation of the optical electronic semiconductor device over a device having, for example, simply a GaInNAs-based quantum well/GaNAs-based barrier layer structure without the antimony species. Although the exact mechanism for improved operation is unknown, the improved operation may result from the antimony species acting as both a surfactant and an alloy constituent. The operation of antimony as a surfactant increases effective incorporation of nitrogen and indium in the quantum well active region resulting in reduced lattice strain and red-shifting the output spectrum. Further, when antimony is a significant constituent of the quantum well alloy, the optical emission of the semiconductor device increases at wavelengths up to approximately 1.6 μm.

A second example embodiment of the present invention is directed to another method for manufacture and an optical electronic semiconductor device using a GaAs-based substrate. An active region having a GaInNAsSb-based quantum well layer surrounded by a pair of GaNAsSb-based barrier layers is formed over the GaAs-based substrate. This implementation improves operation of the optical electronic semiconductor device over a device with a similar structure without incorporation of antimony.

Figure 1:
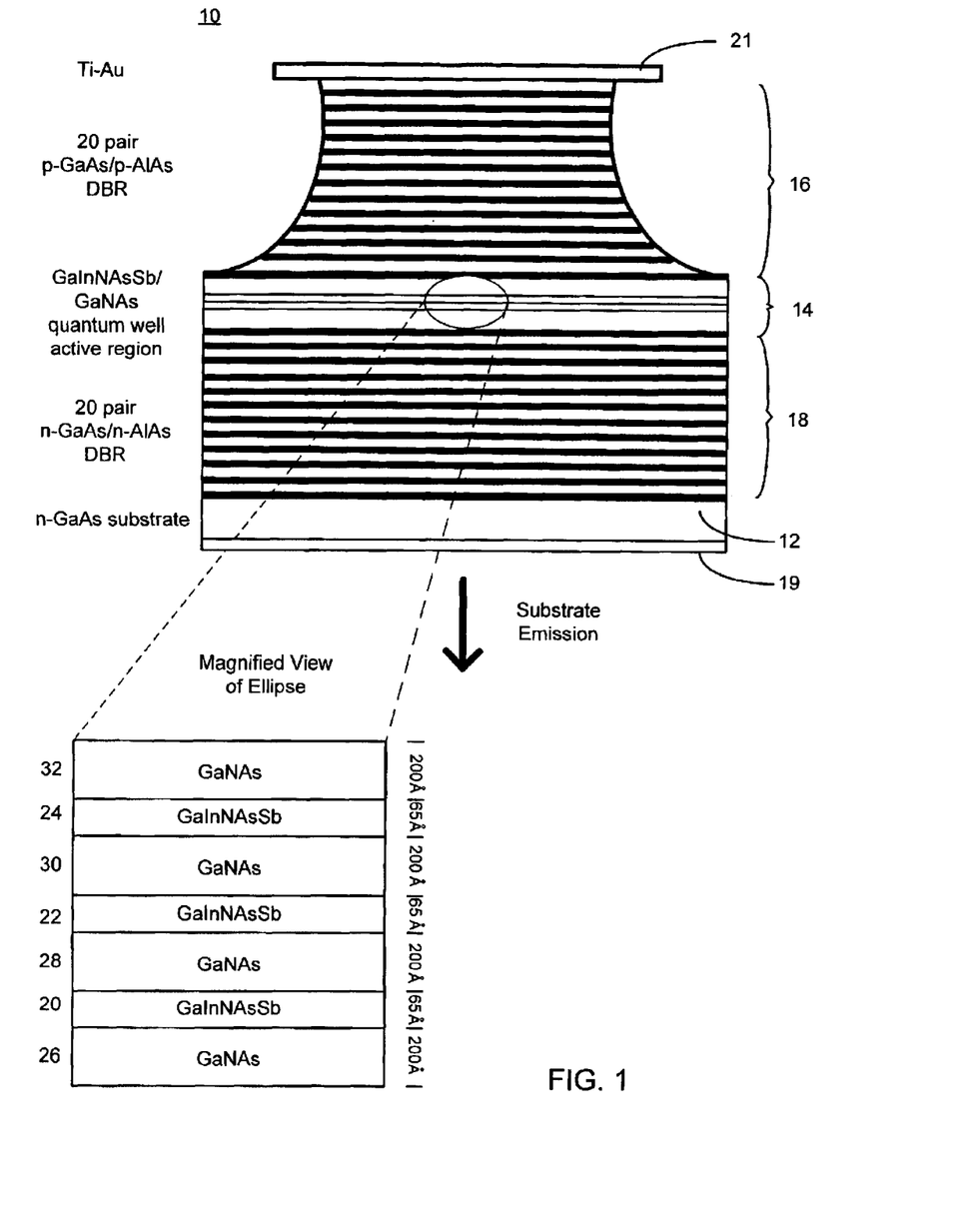
FIG. 1 is a sectional view of a laser diode structure, according to an example application of the present invention.

A specific embodiment of the present invention is illustrated in FIG. 1, as a sectional view of a vertical cavity surface emitting laser (VCSEL) structure 10. The VCSEL structure 10 includes an n+ GaAs substrate 12 upon which various layers are grown to form a GaNAs-based quantum well device. While the number of quantum wells is not critical, the structure 10 in this specific example embodiment includes a triple quantum well active region 14 sandwiched between oppositely doped multilayer reflector structures 16, 18. These reflector structures may be, for example, distributed Bragg reflector (DBR) structures. The upper DBR structure 16 is a 20 pair p-GaAs/p-AlAs DBR, and can be formed along with the other illustrated layers using conventional processing tools and techniques, for example, as discussed in U.S. Pat. Nos. 5,689,123, 5,904,549 and 5,923,691. The lower DBR structure 18 is a 22.5 pair n-GaAs/n-AlAs DBR. To enhance lasing operation, the triple quantum well active region 14 can be surrounded by a GaAs cladding to have the cavity length fit to an integral number of half wavelengths. Also, the active region 14 should be at a maximum in the optical field and for a wavelength long cavity this is in the center.

As shown by the arrow emanating from the n+ GaAs substrate 12, the structure 10 is adapted for substrate emission. For exciting the active region 14, an electrode 19 can be formed on the bottom side of the substrate 12 with a window for the substrate emission, and an electrode 21 can be formed on the surface of the DBR structure 16 substrate to form a laser/optical integrated light source. Although not required, the electrode 21 in this example is implemented using a Ti—Au composition for its conductivity attributes.

The triple quantum well active region 14, as magnified in the lower portion of FIG. 1, is shown to include QW layers 20, 22 and 24, respectively, between GaNAs-based barrier layers 26, 28, 30 and 32. In one example application, this illustrated structure is formed with each of the respective thicknesses of the QW layers 20, 22 and 24 being 65 Å, and each of the respective thicknesses of the GaNAs-based barrier layers 26, 28, 30 and 32 being 200 Å. An example set of compositions of each of the QW layers and the GaNAs-based barrier layers are $In_{0.35}Ga_{0.85}N_{0.02}As_{0.94}Sb_{0.04}$ and $GaN_{0.03}As_{0.97}$, respectively.

In another example, antimony is incorporated into the GaNAs-based barrier regions. The triple quantum well active region 14 includes GaInNAsSb QW layers 20, 22, and 24 between GaNAsSb barrier layers 26, 28, 30, and 32. In this example application, the thickness of the GaInNAsSb QW layers 20, 22 and 24 is 65 Å, the thickness of the GaNAsSb barrier layers 26, 28, 30, and 32 is 200 Å, and the composition of the QW layers and the barrier layers is $In_{0.35}Ga_{0.85}N_{0.02}As_{0.96}Sb_{0.04}$ and $GaN_{0.03}As_{0.97}$, respectively.

Figure 2:
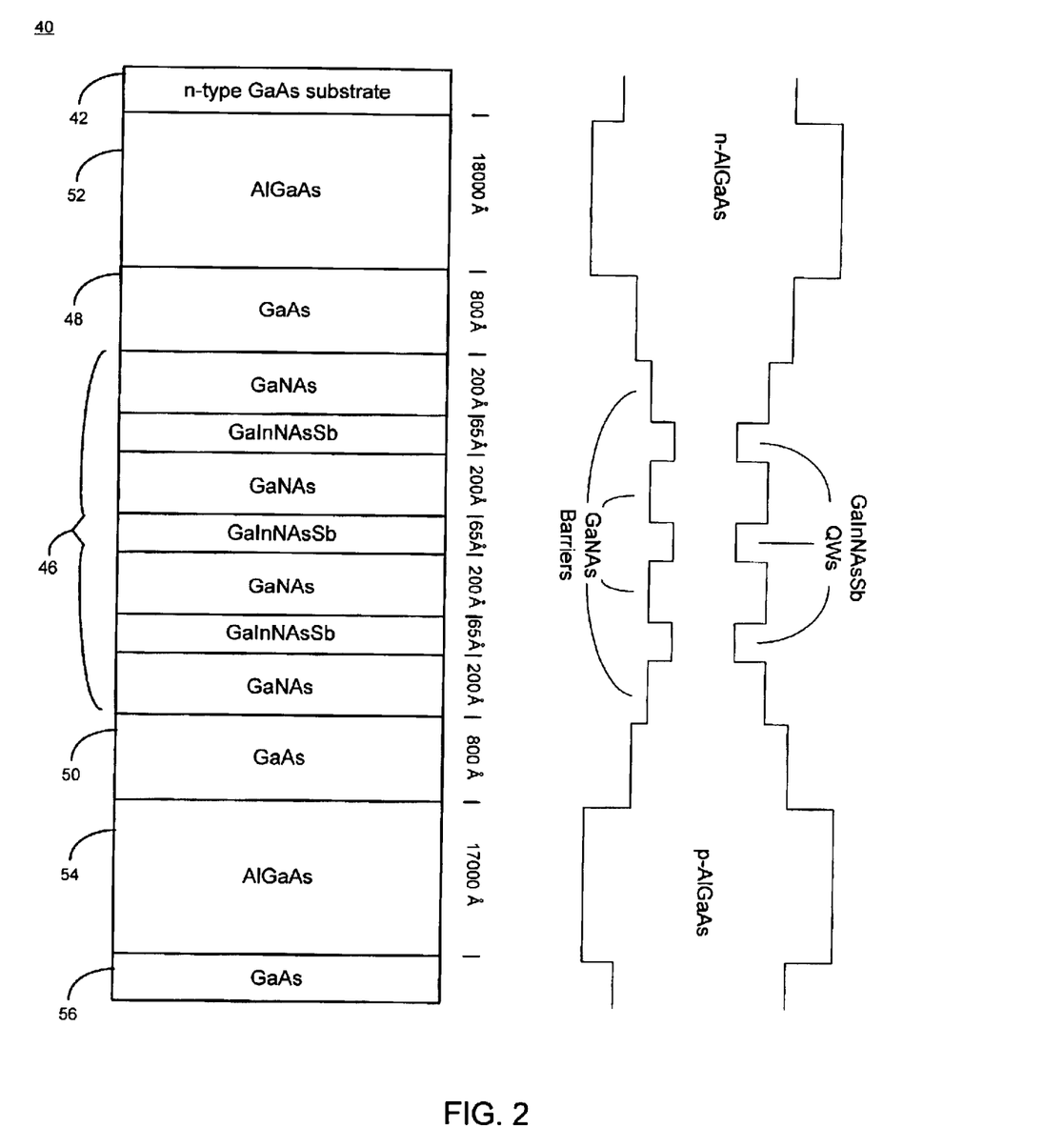
FIG. 2 is a sectional view of an alternate laser diode structure, according to an example application of the present invention.

Other specific example embodiments of the present invention are illustrated by way of FIG. 2 which shows a sectional view of an edge-emitting laser structure 40. Like the above-illustrated VCSEL structure 10, the edge-emitting laser structure 40 includes an n-type GaAs substrate 42 upon which various layers are grown to form a GaNAs-based quantum well laser device. In this specific example embodiment, the structure 40 includes a triple quantum well active region 46 which may be grown using the same thicknesses and layer compositions as discussed above for the triple quantum well active region 14 of FIG. 1.

The illustrated cross section of FIG. 2 also depicts optional GaAs layers 48 and 50 on either side of the active region 46 and to the inside of cladding regions 52 and 54. These GaAs layers 48 and 50, which can also be similarly configured in an alternative embodiment on either side of the active region 14 of FIG. 1, serve to mitigate defects associated with the incorporation of Nitrogen in the barrier layers of the active region. In certain embodiments, the cladding regions 52 and 54 are oppositely-doped portions, and corresponding electrodes are electrically coupled to the respective oppositely-doped portions for exciting the active region. In other embodiments, rather than being oppositely-doped, the cladding regions 52 and 54 are implemented as a tunnel junction structure where the active region is excited using current injection. For further reference on such an approach, reference may be made to Boucart, J. IEEE Photonics Technology Letters, Vol. 11, No. 6, p. 629–31. It will also be appreciated that undoped cladding regions may also be used on either side of the active region in an alternative embodiment for the VCSEL structure 14 of FIG. 1. A related undoped cladding approach is used in conjunction with a VCSEL structure described in the above-referenced U.S. Pat. No. 5,923,691.

In a particular example implementation that is consistent with FIG. 2, each of the GaAs layers 48 and 50 is 800 Angstroms in thickness, the cladding region 52 is n-type (for example, about 18000 Angstroms in thickness and composed of $Al_{0.33}Ga_{0.67}As$ $2.10^{18}/cm^3$ Si), the cladding region 54 is p-type (for example, about 17000 Angstroms in thickness and composed of $Al_{0.33}Ga_{0.67}As$ $7.10^{17}/cm^3$ Be). Contact layer 56 can be implemented, for example, using a 800-Angstrom layer thickness and a composition of GaAs $1.10^{19}/cm^3$ Be.

As with the VCSEL structure 10, the active region 46 can be excited using electrodes (not shown) on either side of the illustrated structure.

Instead of the triple-layer approach depicted in FIGS. 1 and 2, in other embodiments for the VCSEL and edge-emitting structures of FIGS. 1 and 2, a single GaInNAsSb QW layer or multiple GaInNAsSb QW layers are arranged between GaNAs or GaNAsSb barrier layers.

Each of the above-discussed approaches relates to the discovery herewith that the addition of small amounts of Sb to GaInNAs improves the photoluminescence (PL) for compositions that emit beyond 1.3 $\mu$m. Sb acts both as a surfactant, improving N and In incorporation at the surface, and as an alloy constituent, further shifting the emission to longer wavelengths. Quantum well strain can be compensated for by properly balancing the N concentration with respect to concentrations of In and Sb and by the use of tensile barriers using materials such as GaNAs or GaNAsSb to reduce mechanical stress and prevent relaxation.

Increasing N or In concentrations to achieve longer wavelengths without the use of Sb results in significantly reduced luminescent efficiency. Current methods attempt to optimize material compositions, growth conditions or post-growth thermal anneals. However, even under optimized conditions, GaInNAs luminescence decreases significantly as the wavelength increases beyond 1.25 m. With the addition of Sb to GaInNAs quantum wells, high luminescent output is maintained for wavelengths between 1.3 and 1.6 $\mu$m. By using GaNAs barriers between quantum wells, thicker gain quantum well regions can be grown, increasing optical gain. Increased In concentrations and Sb concentrations contribute to the wavelength red-shift of the grown material. Both Sb monomer and dimer species may be used in molecular beam epitaxy (MBE) growth of the materials and were found to produce similar results. Using the GaInNAsSb alloy of GaAs, low threshold current single and multiple edge emitting lasers and VCSELs were grown with room temperature emission from 1.3 to 1.6 $\mu$m.

In one implementation, the growth of Nitride-Arsenides is performed in a Varian Gen II Mod system using elemental sources. Group III fluxes are provided by thermal effusion cells, dimeric arsenic is provided by a thermal cracker, and reactive nitrogen is provided by an RF plasma cell. The plasma conditions that maximize the amount of atomic nitrogen versus molecular nitrogen can be determined using the emission spectrum of the plasma. A thermal cracking effusion cell may be used to provide a source of Sb during growth of the active layer.

The material may be thermally annealed, for example, for 30 seconds at 775 C under an $N_2$ ambient with a proximity cap. The thermal anneal step helps to increases the photoluminescence of the sample and shifts the photoluminescence to shorter wavelengths. The increase in the PL efficiency due to the anneal results from a decrease in non-radiative recombination centers associated with point defects. Because the impurity concentration in the material is low, the result is crystal defects associated with nitrogen incorporation. Further, the crystal quality of GaNAs-based materials increases with annealing.

Figure 3:
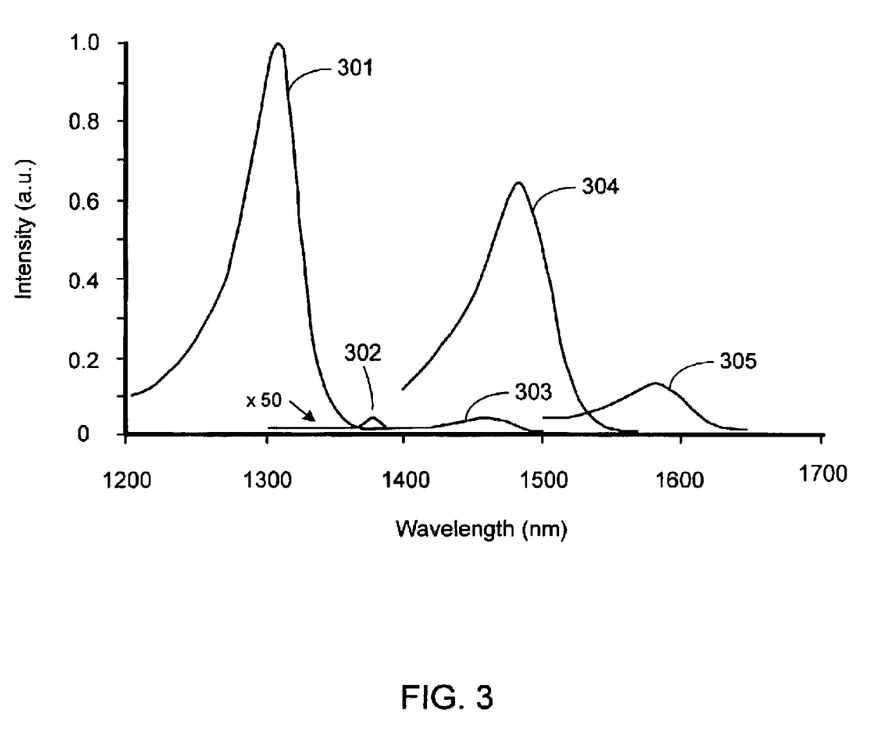
FIG. 3 is a graph showing five photoluminescence spectra for samples having various concentrations of Sb in the active region, according to the present invention.

FIG. 3 shows graphs for the PL spectra of five different samples utilizing 3 quantum wells and associated barrier layers. The samples were produced under similar growth and anneal cycles. Two of the samples, corresponding to PL spectra 301 and 302, utilize without Sb incorporation during fabrication. Three of the samples, corresponding to PL spectra 303, 304 and 305, utilize GaInNAsSb quantum well/GaNAsSb barriers that incorporate Sb during growth. The graphs 301, 302, 303, 304 and 305 are normalized with respect to the highest luminescent output for comparison. The first graph 301 shows the PL spectrum of a sample with three 2.5% N 38% In GaInNAs quantum wells sandwiched between GaNAs barrier layers. This sample has a maximum PL emission at 1.3 $\mu$m. When the In concentration increases to 42%, as shown in the second graph 302, PL emission at 1.38 $\mu$m is achieved, however, the intensity is reduced over 1000 times.

Graphs 303, 304 and 305 represent Pl emission for samples incorporating Sb during active region growth for relatively the same GaInNAs compositions as set forth above. For these samples, Sb was added to the GaInNAs composition during active region growth producing GaInNAsSb quantum wells and GaNAsSb barrier layers. Incorporation of Sb into the samples produced PL at wavelengths from 1.46 to 1.6 m, with the highest efficiency material sample at 1.48 $\mu$m. The 1.48 $\mu$m sample displays an PL efficiency that is 65% of the highest emitting 1.3 $\mu$m sample grown without Sb.

Figure 4:
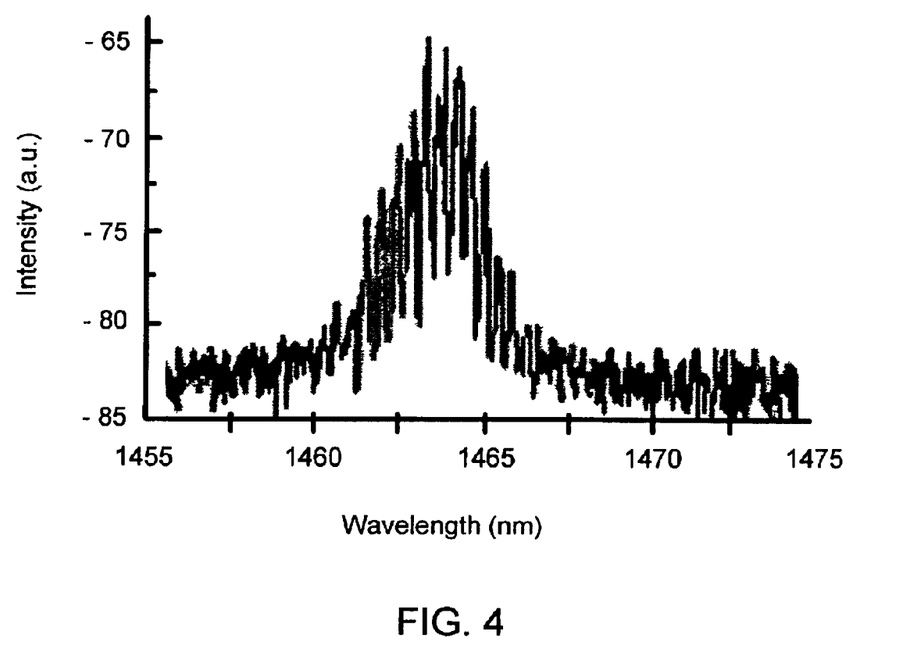
FIG. 4 is a graph of the optical spectrum of a GaInNAsSb/GaNAsSb three quantum well laser according to an example application of the present invention.
Figure 5:
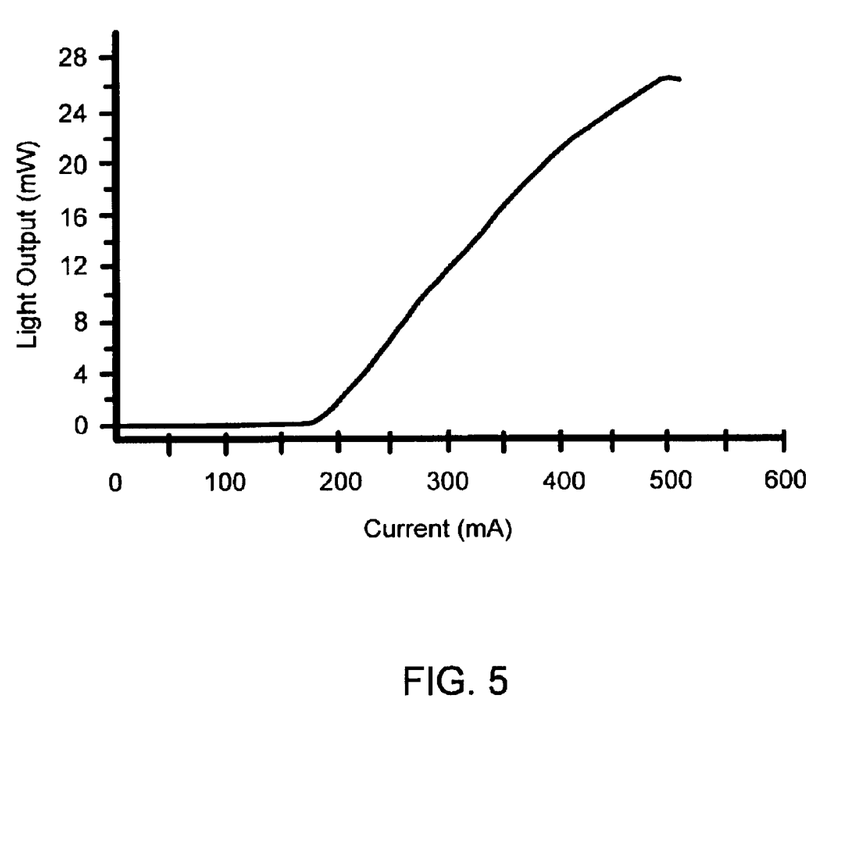
FIG. 5 is a graph of L vs. I for a GaInNAsSb/GaNAsSb three quantum well laser according to an example application of the present invention.

Laser devices were grown and fabricated with 44% In, 2.5% N GaInNAsSb wells and GaNAsSb or GaNAs barrier layers. A flux of $6.89 \times 10^{-8}$ torr of Sb was used during well and/or barrier growth. This flux has been measured to incorporate about 7% Sb into GaInNAs. FIG. 4 shows the optical spectrum and FIG. 5 shows the L-I plot for a representative laser device with measurements produced with a pulsed current source at room temperature. The peak wavelength of 1.464 $\mu$m was taken at 1.2 times the threshold current density. A threshold current density of 2.8 $KA/cm^2$ was measured for the devices with a width of approximately 5 $\mu$m and length of approximately 1.3 mm.

A broad range of compositions exist for the active material by varying In, N and Sb concentrations in order to optimize device efficiency. By modifying quantum well and barrier thickness or by increasing or decreasing the number of quantum wells, the active region may be designed to suit a desired application. The GaNAs or GaNAsSb barrier compositions may be changed or modified, for example, by the addition of P or Al to control strain compensation and conduction/valence band offsets. Growth conditions, including substrate temperature, As overpressure, growth rate, and post-growth thermal anneals may be varied to optimize material properties.

The embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes include, but are not necessarily limited to variations of the example compositions and thicknesses, variations of some of the process steps used to achieve less than all of the advantages described, and various application-directed alterations for circuit integration implementations such as described and/or illustrated for example in connection with the illustrated embodiments of the other above-mentioned patents. Such modifications and changes do not depart from the true spirit and scope of the present invention that is set forth in the following claims.

What is claimed is:

1. An optical-electronic semiconductor device, comprising:
    a GaAs-based substrate;
    an active region over the GaAs-based substrate, the active region including a GaInNAsSb-based quantum well layer adjacent a GaNAs-based barrier layer.

2. The device of claim 1, wherein the active region includes multiple GaInNAsSb-based quantum well layers, each of the GaInNAsSb-based quantum well layers located between a pair of a GaNAs-based barrier layers.

3. The device of claim 1, wherein each GaInNAsSb-based quantum well layer is composed of GaInNAsSb and each GaNAs-based barrier layer is composed of GaNAs.

4. The device of claim 1, wherein the GaInNAsSb-based quantum well layer is composed of GaInNAsSb and the GaNAs-based barrier layer is composed of GaNAsSb.

5. The device of claim 1, wherein the active region includes another layer between the GaInNAsSb quantum well layer and the GaNAs barrier layer.

6. The device of claim 1, wherein the active region has been annealed to reduce point defects.

7. The device of claim 1, further including oppositely-doped portions of the optical-electronic semiconductor device above and below the active region.

8. The device of claim 7, further including electrodes electrically coupled to the respective oppositely-doped portions and adapted for exciting the active region.

9. The device of claim 1, further including cladding regions implemented about the active region as a tunnel junction structure and wherein the active region is excited using current injection.

10. An optical-electronic semiconductor device, comprising:

a GaAs-based substrate;

an active region over the GaAs-based substrate, the active region including a GaInNAsSb-based quantum well layer adjacent a GaNAs-based barrier layer and including crystal-defect causing impurities, the active region being annealed to reduce point defects in the active region;

portions of the optical-electronic semiconductor device electrically coupled to the active region and adapted for exciting the active region.

11. The device of claim 10, further including oppositely-doped portions of the optical-electronic semiconductor device above and below the active region, and corresponding electrodes electrically coupled to the respective oppositely-doped portions adapted for exciting the active region.

12. The device of claim 10, wherein the active region includes multiple GaInNAsSb-based quantum well layers, each of the GaInNAsSb-based quantum well layer located between a pair of a GaNAs-based barrier layers.

13. The device of claim 10, wherein the GaInNAsSb-based quantum well layer is composed of GaInNAsSb and the GaNAs-based barrier layer is composed of GaNAs.

14. The device of claim 13, wherein the active region includes a thin GaAs layer between the GaInNAsSb quantum well layer and the GaNAs barrier layer.

15. The device of claim 10, wherein the GaInNAsSb-based quantum well layer is composed of GaInNAsSb and the GaAsN-based barrier layer is composed of GaNAsSb.

16. The device of claim 15, wherein the active region includes a thin GaAs layer between the GaInNAsSb quantum well layer and the GaAsNSb barrier layer.

17. The device of claim 10, further including a layer over the annealed active region.

18. The device of claim 17, wherein the layer and the annealed active region are configured with minimum number of non-radiative recombination centers to optimize device performance.

19. The device of claim 17, wherein the layer over the annealed active region is immediately adjacent the annealed active region.

20. The device of claim 17, wherein the layer over the active region is a cladding layer.

21. The device of claim 17, wherein the layer over the active region is a mirror layer.

22. The device of claim 10, further including first and second mirror regions respectively above and below the active region, and being configured with the corresponding electrodes as a vertical cavity surface emitting optical-electronic semiconductor device.

23. A vertical cavity surface emitting optical-electronic semiconductor device, comprising:

a GaAs-based substrate;

a first DBR region over the GaAs-based substrate;

an active region over the first DBR region, the active region including a GaInNAsSb quantum well layer adjacent a GaAsN barrier layer and including crystal-defect causing impurities, the active region having been annealed to reduce point defects in the active region;

a second DBR region over the annealed active region, the first and second DBR regions being oppositely-doped; and oppositely-doped electrodes electrically coupled to the correspondingly respective first and second DBR regions, the electrodes being adapted for exciting the active region and causing emissions through the GaAs-based substrate.

24. An edge-emitting optical-electronic semiconductor device, comprising:

a GaAs-based substrate;

an active region over the GaAs-based substrate, the active region including multiple GaInNAsSb-based quantum well layers, each being surrounded by a pair of adjacent GaNAs-based barrier layers;

a first and a second cladding portion electrically coupled to the quantum well active region and adapted for exciting the active region.

25. A method for manufacturing an optical-electronic semiconductor device, comprising:

providing a GaAs-based substrate;

forming an active region over the GaAs-based substrate, the active region including a GaInNAsSb-based quantum well layer adjacent a GaNAs-based barrier layer; and forming portions electrically coupled to the active region and adapted for exciting the active region.

26. The method of claim 25, wherein forming an active region includes forming multiple GaInNAsSb-based quantum well layers, each of the GaInNAsSb-based quantum well layer located between a pair of a GaNAs-based barrier layers.

27. The method of claim 25, wherein each GaInNAsSb-based quantum well layer is composed of GaInNAsSb and each GaNAs-based barrier layer is composed of GaNAs.

28. The method of claim 25, wherein each GaInNAsSb-based quantum well layer is composed of GaInNAsSb and each GaNAs-based barrier layer is composed of GaNAsSb.

29. The method of claim 25, wherein forming an active region includes forming a thin GaAs layer between the GaInNAsSb quantum well layer and the GaNAs barrier layer.

30. The method of claim 25, wherein forming an active region includes forming a thin GaAs layer between the GaInNAsSb quantum well layer and the GaNAsSb barrier layer.

31. The method of claim 25, wherein forming an active region over the GaAs-based substrate includes forming the active region with crystal-defect causing impurities, and further including reducing point defects in the active region.

32. The method of claim 25, wherein forming an active region over the GaAs-based substrate includes increasing soluble incorporation N and In into the active region during formation of the active region.

33. The method of claim 32, wherein increasing soluble incorporation at the surface of the active region includes reducing the surface energy of the active region.

34. The method of claim 33, wherein increasing soluble incorporation at the surface of the active region includes increasing the incorporation of N and In at the surface of the active region.

35. The method of claim 32, wherein increasing soluble incorporation of N and In at the surface of the active region includes using Sb as a surfactant.

36. A method for manufacturing an optical-electronic semiconductor device, comprising:
   providing a GaAs-based substrate;
   forming an active region over the GaAs-based substrate, the active region including a GaInNAsSb-based quantum well layer adjacent a GaNAs-based barrier layer;
   growing a layer over the active region while annealing the active region; and
   providing portions of the optical-electronic semiconductor device electrically coupled to the active region and adapted for exciting the active region.

37. The method of claim 36, wherein growing a layer over the active region while annealing the active region includes controlling the growth temperature to optimize device performance.

38. The method of claim 37, wherein controlling the growth temperature to optimize device performance includes minimizing non-radiative recombination in GaNAs based layers.

39. The method of claim 37, wherein forming an active region includes forming multiple GaInNAsSb-based quantum well layers, each of the GaInNAsSb-based quantum well layers located between a pair of a GaNAs-based barrier layers.

40. The method of claim 36, wherein growing a layer over the active region includes growing the layer directly on the active region.

41. The method of claim 40, wherein growing a layer over the active region includes growing a cladding layer.

42. The method of claim 40, wherein growing a layer over the active region includes growing a mirror layer.

43. The method of claim 36, wherein the GaInNAsSb-based quantum well layer and the GaAsN-based barrier layer are respectively composed of GaInNAsSb and GaNAs.

44. The method of claim 43, wherein forming an active region includes forming a thin GaAs layer between the GaInNAsSb quantum well layer and the GaNAs barrier layer.

45. The method of claim 36, wherein the GaInNAsSb-based quantum well layer and the GaAsN-based barrier layer are respectively composed of GaInNAsSb and GaNAsSb.

46. The method of claim 45, wherein forming an active region includes forming a thin GaAs layer between the GaInNAsSb quantum well layer and the GaNAsSb barrier layer.

47. The method of claim 36, wherein the active region includes crystal-defect causing impurities, and wherein annealing the active region includes reducing point defects in the active region.

48. The method of claim 36, wherein forming an active region over the GaAs-based substrate includes increasing soluble incorporation of In and N into the active region during formation of the active region.

49. The method of claim 48, wherein increasing soluble incorporation at the surface of the active region includes reducing the surface energy of the active region.

50. The method of claim 49, wherein increasing soluble incorporation at the surface of the active region includes increasing the incorporation of In and N at the surface of the active region.

51. The method of claim 48, wherein increasing soluble incorporation at the surface of the active region includes using Sb as a surfactant.

52. A method for generating optical emission from an optical-electronic device, comprising
   providing a GaAs-based substrate;
   forming an active region over the GaAs-based substrate, the active region including a GaInNAsSb-based quantum well layer adjacent a GaNAs-based barrier layer;
   forming portions electrically coupled to the active region and adapted for exciting the active region; and
   exciting the active region to produce optical emission at wavelengths of about 1.6 $\mu$m.

53. A method for manufacturing a VSCEL optical-electronic device, comprising:
   providing a GaAs-based substrate;
   forming a multiple quantum well active region over the GaAs-based substrate, the active region including multiple GaInNAsSb-based quantum well layers, each being surrounded by a pair of adjacent GaNAs-based barrier layers;
   forming mirror portions on either side of the multiple quantum well active region and adapted for exciting the active region.

54. The method of claim 53, wherein the mirror portions are oppositely doped DBR sections.

55. A method for manufacturing an edge-emitter optical-electronic semiconductor device, comprising:
   providing a GaAs-based substrate;
   forming a multiple quantum well active region over the GaAs-based substrate, the active region including multiple GaInNAsSb-based quantum well layers, each being surrounded by a pair of adjacent GaNAs-based barrier layers;
   forming cladding portions electrically coupled to the quantum well active region and adapted for exciting the active region.

* * * * *

UNITED STATES PATENT AND TRADEMARK OFFICE
CERTIFICATE OF CORRECTION

PATENT NO. : 6,798,809 B1
DATED : September 28, 2004
INVENTOR(S) : Gambin et al.

It is certified that error appears in the above-identified patent and that said Letters Patent is hereby corrected as shown below:

Column 2,
Line 41, "wavelengths" should read -- wavelength --.

Column 3,
Line 14, "layer" should read -- layer. --.

Column 6,
Lines 19-20, "$In_{0.35}Ga_{0.85}N_{0.02}As_{0.94}Sb_{0.04}$ and $GaN_{0.03}As_{0.97}$, respectively." should read -- $In_{0.35}Ga_{0.65}N_{0.02}As_{0.94}Sb_{0.04}$ and $GaN_{0.03}As_{0.97}$, respectively. --.
Lines 29-30: "$In_{0.35}Ga_{0.85}N_{0.02}As_{0.96}Sb_{0.04}$ and $GaN_{0.03}As_{0.97}$, respectively." should read -- $In_{0.35}Ga_{0.65}N_{0.02}As_{0.94}Sb_{0.04}$ and $GaN_{0.03}As_{0.97}$, respectively. --.
Line 69, "$AI_{0.33}Ga_{0.67}As\ 2.10^{18}/cm^3\ Si$)," should read -- $AI_{0.33}Ga_{0.67}As2.10^{18}/cm^3\ Si$), --.

Column 7,
Line 1, "$AI_{0.33}Ga_{0.67}As\ 7.10^{17}/cm^3\ Be$)." should read -- $AI_{0.33}Ga_{0.67}As\ 7.10^{17}/cm^3\ Be$). --.
Line 55, "increases" should read -- increase --.

Signed and Sealed this

Nineteenth Day of April, 2005

JON W. DUDAS
*Director of the United States Patent and Trademark Office*